(12) United States Patent
Suzuki

(10) Patent No.: US 6,496,446 B2
(45) Date of Patent: Dec. 17, 2002

(54) SEMICONDUCTOR MEMORY DEVICE HAVING BURST READOUT MODE AND DATA READOUT METHOD

(75) Inventor: Junnichi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/865,543

(22) Filed: May 29, 2001

(65) Prior Publication Data

US 2001/0046178 A1 Nov. 29, 2001

(30) Foreign Application Priority Data

May 29, 2000 (JP) ........................................ 2000-159024

(51) Int. Cl.[7] ................................................ G11C 8/00
(52) U.S. Cl. .............................. 365/238.5; 365/230.06; 365/235
(58) Field of Search ......................... 365/238.5, 230.06, 365/230.08, 235, 236, 229, 189.05

(56) References Cited

U.S. PATENT DOCUMENTS 5,488,587 A * 1/1996 Fukumoto ................... 365/222
5,812,492 A * 9/1998 Yamauchi et al. ........... 365/193
6,288,940 B1 * 9/2001 Kawamura .............. 365/185.09

FOREIGN PATENT DOCUMENTS

| JP | 9-106689 | 4/1997 |
| JP | 11-176185 | 7/1999 |

* cited by examiner

Primary Examiner—David Nelms
Assistant Examiner—Thong Le
(74) Attorney, Agent, or Firm—Young & Thompson

(57) ABSTRACT

A semiconductor memory having burst mode operation includes a memory cell array, a sense amplifier circuit determining data of memory cells, a latch circuit having first and second latch groups and latching data of a sense amplifier, an enable circuit provided with an chip enable signal and controlling readout operation the semiconductor. The enable circuit instructs the circuit for readout operation to activate until the latch circuit latches data even if the chip enable signal indicates stopping the readout operation of semiconductor memory to output data of memory cells correctly.

14 Claims, 8 Drawing Sheets

SEMICONDUCTOR MEMORY DEVICE HAVING BURST READOUT MODE AND DATA READOUT METHOD

BACKGROUND OF THE INVENTION

1. Field of the Invention

The present invention relates to a semiconductor memory device, and more particularly, to a semiconductor memory device having a burst access mode enabling fast reading for use in a memory card or the like.

2. Description of Related Art

Recently an integration size of a semiconductor device has been increased by a progress of process technologies, thereby increasing an operation speed. Particularly it is remarkably increasing the operation speed of a CPU (central processing unit). According to increment of the operation speed of CPU, it is required to increase a readout operation speed of semiconductor memory.

Specifically music information or image information such as animation stored in a single semiconductor chip is reproduced by means of a speaker or by means of a display unit. If a read-out speed fluctuates during reading the music or image information, the reproduced music or image information becomes discontinuous, interfering with the user's enjoyment.

Therefore, a high and constant speed operation is required for the readout processing of the music or image information.

In response to the request for a high-speed access to the semiconductor memory in the above, a burst mode is used for the operation of the semiconductor memory. In the burst mode, when a reference address is provided for the semiconductor memory, all of data corresponding to a page is previously latched. Subsequently, an internal circuit continuously generates addresses for burst mode, the latched data are readout in response to the addresses. That is, it is not necessary to read an address anew whenever data is read. Thus, a readout operation speed of semiconductor memory can be increased.

In other words, as shown in FIG. 5, 16-byte data of memory cells having byte 0 to byte 15 are read out during a latency period and subsequently 16-byte data of memory cells having byte 16 to byte 31 are read out while the data of the byte 0 to byte 15 are output. This readout operation is sequentially repeated.

In the burst mode, however, the semiconductor memory is provided with the next page address anew every readout operation of one page. Therefore, it is necessary to have time for decoding the next page address and reading page data from the memory cells by using a sense amplifier.

Furthermore, as shown in FIG. 6, when data is read from the middle of the 16 byte data, for example, from byte 15, only a readout period of a single byte data is allowed. However, the period is not sufficient to read the next page data (from byte 16 to byte 31) from memory cells, so that a continuous data output cannot be performed.

Therefore, in a method of latching a single-page data as described above, practically there is a limit to an improvement of an access time for a high-speed access. Accordingly a system with such a semiconductor memory cannot be improved in its processing speed.

To remove the above disadvantage, Japanese Kokai No. 9-106689 discloses an arrangment in which each bit line is connected to a sense amplifier and a latch so that a new address need not be inputted whenever a page is changed to the next one.

That is, data is read from all the bit lines all together and each data is stored in a latch. Thus, fast read/write page operation is performed without a new address, except for selecting a word line. Consequently, a system having such semiconductor memory does not need a page readout time for changing a page, thereby improving the speed of readout operation.

The above semiconductor memory, however, has to be equipped with sense amplifiers corresponding to all bit lines, and latches for storing data of these sense amplifiers. Although the speed of read-out operation increases, a chip size of such semiconductor memory is larger than that of a general semiconductor memory having the same capacity, since the sense amplifiers and the latches occupy a very large area of the chip area.

In addition, the semiconductor memory having the sense amplifiers corresponding to all bit lines has a very large power consumption in a data readout or other operations. If a portable information unit driven by a battery uses such semiconductor memory, the semiconductor memory reduces the operation time of the portable information unit.

Japanese Kokai No. 11-176185 discloses the semiconductor memory device including memory cell array divided into a plurality of blocks and a sense amplifiers shared between a plurality of columns in each of the blocks. The data of selected columns in the plurality of blocks is treated as a set of data.

According to such semiconductor memory device, after a first set of data is transferred from a sense amplifier to a shift register, a column address is incremented and the sense amplifier reads a second set of data. Then, the last data of the first set of data transferred to the shift register and the second set of data is transferred to the shift register. After the column address is incremented, the sense amplifier reads a third set of data.

This semiconductor memory device starts an output of data from the shift register after a predetermined random access time (for example, 1 μsec). However, this semiconductor memory device is not provided with any means of detecting whether the second set of data is determined by the sense amplifier when all of the first set of data is output.

Therefore, if a random access time of an external circuit or an external unit is shorter than that of the semiconductor memory, the external circuit or the external unit reads out the second set of data from the shift register after outputting the first set of data, though all of the second set of data has not been determined yet. Accordingly, the external circuit and the external unit cannot receive accurate data.

In addition, after transferring the first set of data from the sense amplifier to the shift register, the column address is incremented, and the sense amplifier reads the second set of data. That is, the sense amplifier is always operating. Accordingly, the current always flows through the sense amplifier, thereby increasing the current consumption.

To resolve the above problems, a semiconductor memory device having a plurality of memory cell arrays divided into a plurality of blocks, each of sense amplifiers sharing a plurality of columns in each of the blocks, and two systems of latches for storing data from each of the sense amplifiers is considered.

In such semiconductor memory device, as shown in FIG. 7, during 16-byte data output, byte 0 to byte 15, stored in one latch, another 16-byte data, byte 16 to byte 31, is read out from memory cells and is stored in the other latch in response to a latch signal. In the timing chart shown in FIG. 7, when a chip select signal CE is at a High level, the semiconductor memory is available.

The semiconductor memory device sequentially repeats this reading and storing process for respective latches. The sense amplifier is assumed to be in an operating condition (signal SAEB is at a Low level) only for a period of reading data for latches.

The number of sense amplifiers can be decreased by performing the data output and the data storing alternately. Therefore, an access time improvement is achieved in the burst mode without any enlargement of a chip area and any increase of power consumption, since the sense amplifiers are driven only for reading data from the memory cells.

However, if the chip select signal CE changes to a Low level, all of the circuits in the memory are brought into an unavailable condition (standby condition), while the data outputting and the data storing are performed alternately. That is, the operation of the sense amplifier is interrupted and the latches which store next data cannot store accurate data.

In other words, as shown in FIG. 8, in the standby condition, the sense amplifier and a word line change from an active condition to an inactive condition. Thus, data read from the memory cells to the sense amplifier circuit vanish.

After that, even if the chip select signal CE changes to a High level and the semiconductor memory changes from the standby condition to the active condition, data cannot be read from the memory cell to the sense amplifier circuit, since a word line does not drop to a sufficiently low voltage level in a short time.

Consequently, the sense amplifier cannot accurately determine data of the memory cell and the latches cannot store accurate next data. After data from byte 0 to byte 15 is read out from one latch, data from byte 16 to byte 31 that is output from the other latch is not correct.

SUMMARY OF THE INVENTION

An object of the present invention is to provide a semiconductor memory device, which allows high and constant speed readout operation without enlargement of chip area.

Another object of the present invention is to provide a semiconductor memory device, which outputs data of memory cells correctly.

A semiconductor memory device according to the present invention includes a memory cell array having a plurality of memory cells; a plurality of word lines connected to the memory cells; a row decoder connected to the word lines so as to selectively enable one of the word lines; a plurality of digit lines coupled to the memory cells; a sense amplifier circuit having a plurality of sense amplifiers, each of the sense amplifiers being coupled to a respective one of the digit lines; a first latch circuit connected to the sense amplifier circuit so as to latch data of the digit lines; and a control circuit coupled to the row decoder and provided with a chip enable signal which is indicative of an operation mode of the semiconductor memory device so as to inactivate the row decoder when both the first latch circuit finishes latching the data of the digit lines and the chip enable signal is indicative of standby mode of the semiconductor memory device.

These and other objects of the present invention will be apparent to those of skill in the art from the appended claims when read in light of the following specification and accompanying figures.

DETAILED DESCRIPTION OF THE PREFERRED EMBODIMENTS

Figure 1:
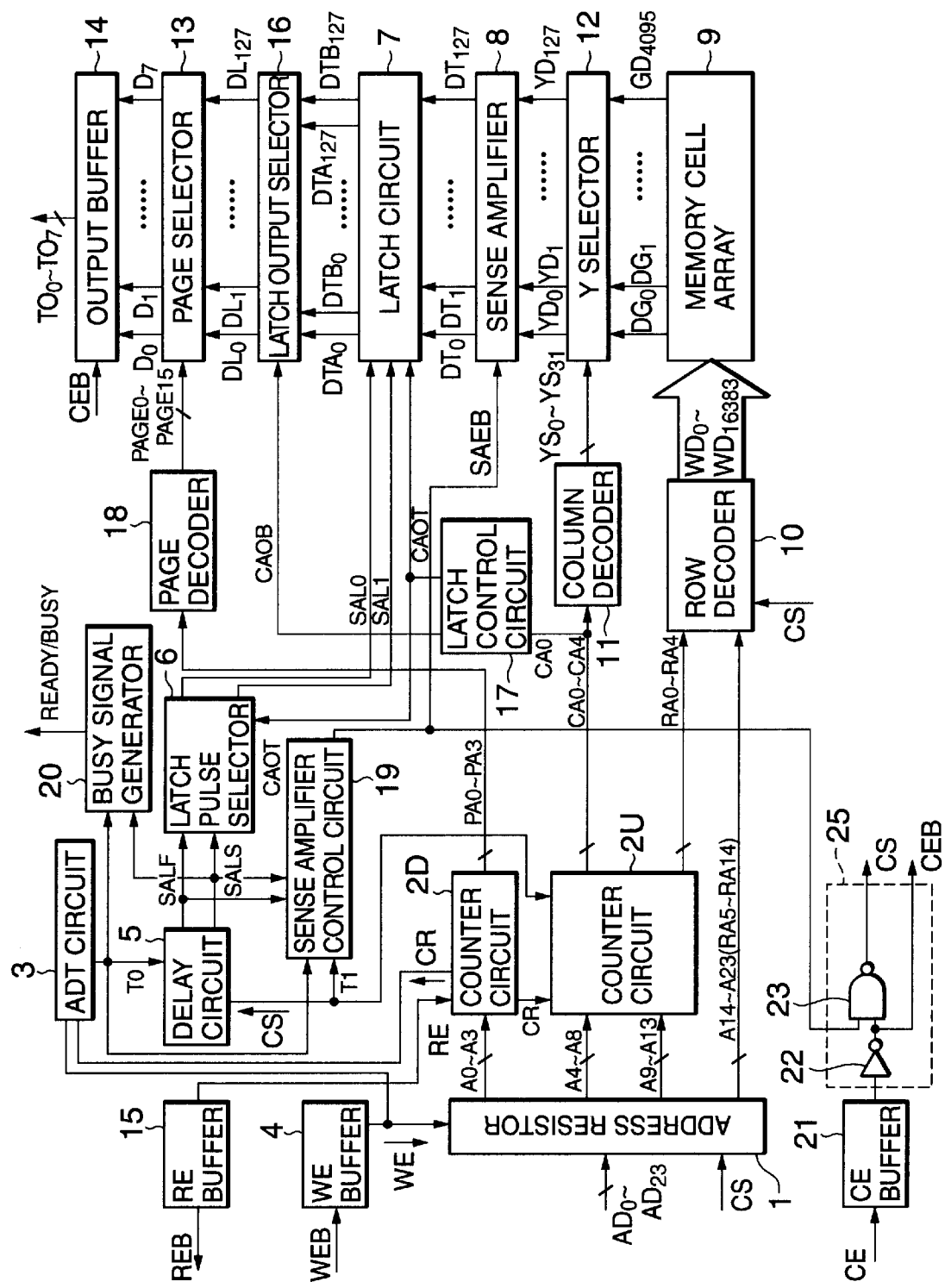
FIG. 1 is a block diagram showing a semiconductor memory according to an embodiment of the present invention.

Referring to FIG. 1, the semiconductor memory according to the present invention will be described. While FIG. 1 shows an arrangement of a mask ROM (read-only memory) having a capacity of 128 megabits in 8-bit outputs as a sample configuration, the present invention is not limited to the mask ROM.

In FIG. 1, an address register 1 shapes waveforms of 24-bit address signals AD0 to AD23 to be inputted via an input terminal and converts them to those having voltage levels for an internal circuit so as to generate internal address signals A0 to A13 and row address signals RA5 to RA14. In addition, the address register 1 latches the internal address signals A0 to A13 and row address signals RA5 to RA14, for example, in response to rising edge of a write signal WE. Subsequently, the address register 1 outputs the latched internal address signals A0 to A3 to a first counter circuit 2D and outputs the internal address signals A4 to A13 to a second counter circuit 2U.

The first counter circuit 2D is a 4-bit counter. The first counter circuit latches the internal address signals A0 to A3 as initial value of burst address in response to the rising edge of a control signal T0. The first counter circuit 2D starts count in response to the rising edge of a read control signal RE.

Furthermore, The first counter circuit 2D outputs the counted value to a page decoder 18 as page address signals PA0 to PA3. When the counted value changes from "1111" to "0000", the first counter circuit 2D outputs a carry signal CR to a second counter circuit 2U. The most significant bit of the counted value "1111" corresponds to a value of a page address signal PA3 and the least significant bit corresponds to a value of a page address signal PA0.

The second counter circuit 2U is a 10-bit counter. The second counter circuit 2U latches the internal address signals A4 to A13 as initial values of burst address in response to rising edge of the control signal T0. The second counter circuit 2U starts count in response to rising edge of a control signal T1 or a rising edge of the carry signal CR.

Furthermore, the second counter circuit 2U generates column address signals CA0 to CA4 by using lower 5 bits among 10 bits and outputs column address signal CA0 to CA4 to a column decoder 11. Additionally the second counter circuit 2U generates row address signals RA0 to RA4 by using upper 5 bits among 10 bits and outputs row address signals RA0 to RA4 to a row decoder 10. The row decoder 10 is provided with the row address signal RA0 to RA4 and the other row address signal RA5 to RA14 that is outputted from the address resistor 1.

Therefore, the burst mode of readout operation can be applied to the word lines. The burst addresses for word lines WD0 to WD16383 can be generated by row address signal RA5 to RA14 as initial value and row address signal RA0 to RA4 as counted value data of the second counter circuit 2U A WE buffer 4 shapes a waveform of signal WEB, converts signal WEB to a signal having a voltage level for an internal circuit, and then outputs as a write signal WE having the same phase as a conversion result.

The ATD circuit 3 detects a change of a write signal WE inputted from the WE buffer 4; if a write signal WE and the carry signal CR are active, the ATD circuit 3 outputs a control signal T0 to first and second counter circuit 2D and 2U and a delay circuit 5. The control signal T0 has a one-shot pulse having a predetermined width of Low level.

The delay circuit 5 delays a control signal T0 and generates a control signal T1 of a pulse having a predetermined width of the same polarity (Low level) as the control signal T0. In addition, the delay circuit 5 delays the control signal T0 to generate a latch pulse signal SALF and delays a control signal T1 to generate a latch pulse signal SALS. The latch pulse signals SALF and SALS is the same polarity as the control signals T0 and T1, respectively. Then, the delay circuit 5 provides the latch pulse signal SALF and the latch pulse signal SALS for a latch pulse selection circuit 6.

The latch pulse selection circuit 6 receives the latch pulse signal SALS and SALF, and outputs pulses of the control signal SAL0 and the control signal SAL1 according to a level of the input control signal CA0T. The latch pulse selector 6 outputs the latch pulse signal SALF as a control signal SAL0 when the control signal CA0T is Low level without outputting a control signal SAL1, and outputs the latch pulse signal SAL1 as a control signal SALL when the control signal CA0T is High level without outputting a control signal SAL0.

The latch pulse signal SAL0 and the latch pulse signal SAL1 are pulses each having a predetermined width and an opposite polarity (High level) to the control signal SALS or the control signal SALF.

An RE buffer 15 shapes a waveform of signal REB and converts signal REB to a signal having a voltage level for the internal circuit and then outputs a read signal RE having the same phase as a result of the conversion.

A row decoder 10 decodes row address signals RA0 to RA4 of the counter circuit 2U and row address signals RA5 to RA14 of the address register 1, activates one of word lines WD0 to WD16383. The row decoder 10 supplies a Low level voltage to a selected word line, which is connected to a gate of a memory cell transistor in a memory cell array 9, and supplies a voltage of a High level to non-selected word lines. The High level which is supplied with non-selected word lines is at a higher voltage than a threshold of an enhancement-type memory cell transistor.

A column decoder 11 decodes column address signals CA0 to CA4 from the counter circuit 2D and generates control signals YS0 to YS31. The column decoder 11 activates one of control signals YS0 to YS31.

Y selector 12 includes a plurality of Y switches, for example, n channel transistors. Each of Y switches is connected to digit lines each of DG0 to DG4095. If one of the control signals YS0 to YS31 of the column decoder 11 is activated, the Y switch whose gate is connected to the active control signal (one of the control signals YS0 to YS31) is turned on and data of the 128 digit lines which is connected to Y switches provided with the active control signal are provided for the sense amplifier circuits 8.

The memory cell array 9 has a matrix of the word lines WD0 to WD16383 intersected by the digit (bit) lines DG0 to DG4095 with a memory cell transistor, not shown, arranged at each intersection. This memory cell is of a NAND type. The data of memory cell transistor is represented by a threshold value of this transistor. In this NAND-type, if a memory cell transistor is of an n-channel type, data "1" is represented as a depletion type by ion implantation of n-type impurities in a memory cell transistor gate and data "0" is represented as an enhancement type by omitting the ion implantation in the memory cell transistor gate.

In NAND type, each of the memory cell transistors (n-channel type) whose source and drain are connected to other memory cell transistors has a gate connected to one of the word selection lines WD0 to WD16383, a source of a memory cell transistor in the last stage is connected to ground, and a drain of a memory cell transistor in the first stage is connected to a digit line DG0 (digit lines DG1 to DG4095). In such NAND type, if the word selection line WD0 is activated (a Low level) and other word lines are deactivated (a High level), the current value corresponding to data of the memory cell transistor whose gate is connected to the activated word line WD0 flows through the digit line.

For example, if data "1" is written into the memory cell transistor whose gate is connected to the activated word line, the memory cell transistor is of a depletion type, thereby enabling the current to flow. On the other hand, if data "0" is written into the memory cell transistor whose gate is connected to the activated word selection line, the memory cell transistor is of an enhancement type, thereby disabling the current to flow.

At this point, a voltage of the activated word line is lower than the threshold value of an enhancement-type memory cell transistor and the enhancement-type memory cell transistor is turned off to disable the current flow. In addition, a voltage of the inactive word selection line is higher than a threshold value of an enhancement-type memory cell transistor and the enhancement-type memory cell transistor is turned on to allow the current to flow. That is, the condition of current represents data of the memory cell transistor. Each of the currents flowing through the digit lines DG0 to DG4095 is selected by the Y selector 12 and is supplied to the sense amplifier circuit 8.

The sense amplifier circuit 8 is composed of a plurality of sense amplifiers for one page, namely, 128 sense amplifiers. In this connection, one page is composed of 16-byte data. Each of the sense amplifiers determines data of memory cells according to current through signal YD0 to YD127. If data is written, the sense amplifier outputs a data signal DTn (n=0-127) which is a High level, or otherwise the sense amplifier outputs a data signal DTn which is a Low level.

The latch control circuit 17 is provided with a column address signal CA0, which is the least significant address in the column address supplied from the first counter circuit 2D. The latch control circuit 17 generates a control signal CA0B having an opposite polarity to the column address signal CA0 and a control signal CA0T having the same polarity as for the column address signal CA0 in a predetermined time period. In addition, the latch control circuit 17 outputs the control signal CA0B to the latch output selector 16 and outputs the control signal CA0T to the latch circuit 7 and the latch pulse circuit 6.

The latch circuit 7 includes first and second latch groups each composed of 128 latch circuits. The latch circuit 7 latches the data signals DT0 to DT127 of the sense amplifier circuit 8 into one of the first and second latch groups in response to the control signal CA0T and latch pulse signal SAL0 or SAL1. The first latch group is selected for storing data when the control signal CA0T is Low level. The second latch group is selected for storing data when the control signal CA0T is High level.

For example, when the control signal CA0T is Low level, the data signals DT0 to DT127 corresponding to the digit lines DG0 to DG127 are latched in the first latch group in response to the latch pulse signal SAL0. When the control signal CA0T is High level, the data signals DT0 to DT127 corresponding to the digit lines DG128 to DG255 are latched in the second latch group in response to the latch pulse signal SAL1.

The latch circuit 7 outputs the data of first latch group as data signals DTA0 to DTA127, and the data of the second latch group as data signals DTB0 to DTB127, to a latch output selector 16.

The latch output selector 16 outputs one of the data signals DTA0 to DTA127 and the data signals DTB0 to DTB127 as data signals DL0 to DL127 in response to a control signal CA0B of a latch control circuit 17.

In other words, the latch output selector 16 outputs the data signals of the first latch group to the page selector 13 when the control signal CA0B is Low level. When the control signal CA0B is High level, the latch output selector 16 outputs the output of the second latch group to the page selector 13.

The page decoder 18 decodes the page address signals PA0 to PA3 from the counter circuit 2D and outputs the control signals PAGE0 to PAGE15 to the page selector 13. For example, the page address signals PA0 to PA3 increases sequentially from hex 0 to hex F, i.e. "0000", "0000", ..., "1110", and "1111". The page decoder 18 outputs the control signals PAGE0 to PAGE15 in a "walking 1" form, i.e. "0000000000000001", "0000000000000010", ..., "0100000000000000", and "1000000000000000". Then, the most significant (leftmost) bit of "0000" corresponds to the page address signal PA3 and the least significant bit (rightmost) corresponds to the page address signal PA0.

The page selector 13 is provided with the data signals DL0 to DL127 from the latch output selector 16. The page selector 13 distributes data signals DL0 to DL127 to output data D0 to D7. Each of output data DL0 to D127 is outputted bit by bit as output data D0 to D7 in response to control signal PAGE0 to PAGE15. The output data D0 to D7 is provided for the output buffer 14. Each of output data D0 to D7 is outputted from output terminals TO0 to TO7. For instance, the output terminal TO0 will be described. Whenever the control signals PAGE0 to PAGE15 changes to one of the 16 values of "0000000000000001", "0000000000000010", ..., "0100000000000000", and "1000000000000000", the data signals DL0 to DL15 are sequentially outputted from the output terminal TO0. Note that, however, the most significant (leftmost) bit of "1000000000000000" corresponds to the control signal PAGE15 and the least significant bit (rightmost) corresponds to the control signal PAGE0.

The output buffer 14 outputs the data signals D0 to D7 to the output terminals T0 to T7, respectively when the read signal RE is High level.

The correspondence between the digit lines DG0 to DG4095 and the output terminal T0 to T7 will now be described.

For example, if the column decoder 11 activates the control signal YS0, the Y selector 12 turns on the Y switches connected to the digit lines DG0 to DG15, the digit lines DG512 to DG527, the digit lines DG1024 to DG1039, the digit lines DG1536 to DG1551, the digit lines DG2048 to DG2063, the digit lines DG2560 to DG2575, the digit lines DG3072 to DG3087, and the digit lines DG3584 to DG3599,. The data of the digit lines selected by Y selector 12 represents data for a page. Each of the digit lines selected by Y selector 12 is connected to sense amplifier circuit 8 through Y switches, and the current flowing through each of the digit lines is provided for sense amplifier circuit 8 as signal YD0 to YD127.

The data of digit lines DG0 to DG511, the digit lines DG512 to DG1023, the digit lines DG1024 to DG1535, the digit lines DG1536 to DG2047, the digit lines DG2048 to DG2559, the digit lines DG2560 to DG3071, the digit lines DG3072 to DG3583, and the digit lines 3584 to DG4095 are outputted from each of output terminals TO0 to TO7, respectively.

When burst readout operation starts, each of the output terminals is provided with 2-byte set of data. For example, data of the digit lines DG0 to DG15, which is connected to Y switches selected by Y selector, is sequentially outputted bit by bit from output terminal TO0 in order. It is the same in other output terminals TO1 to TO7; a 2-byte set is formed at every burst readout processing and data is outputted bit by bit in order from the corresponding digit lines.

The sense amplifier control circuit 19 generates a control signal SAEB to activate the sense amplifier circuit 8 in response to the control signals T0 and T1, the control signal SAEB is provided for the sense amplifier circuit 8. The sense amplifier control circuit 19 controls the timing of determining data of the data signal YD0 to YD127 during a latency period. That is, the sense amplifier circuit 8 is inactivated when the control signal SAEB is High level and is activated when the control signal SAEB is Low level. The activated sense amplifier circuit 8 determines data of memory cell transistor.

A BUSY signal generator circuit 20 outputs a READY/BUSY signal, which is a control signal indicating whether the semiconductor memory is being used by the system. The READY/BUSY signal is outputted based on the control signal T0 and the control signal SALS. The READY/BUSY signal which is Low level indicates that the semiconductor memory is reading data and is in busy condition (in a latency condition) and new access is not available. On the other hand, The READY/BUSY signal which is High level indicates that the semiconductor memory is in a ready condition (in a cyclic operation condition), data read operation has been completed and new access is available.

An enable circuit 25 is provided with an enable signal CE from the CE buffer circuit 21 and generates a control signal CS and a control signal CEB. For example, the enable circuit 25 comprises an inverter 22 and a NAND circuit 23.

The control signal CEB is an inverted signal of output of the CE buffer 21 and is provided for the output buffer 14. When the control signal CEB is Low level, the output buffer 14 is in output mode. When the control signal CEB is High level, the output buffer 14 is in high-impedance mode.

The control signal CS is generated by the NAND circuit 23 and an inverter 22 as a result of non-conjunction between the control signal SAEB and the control signal CEB and provided for the address register 1, the delay circuit 5, and the row decoder 10. That is, the enable circuit 25 outputs a High level control signal CS when one of the control signal SAEB and CEB is Low level.

Accordingly, the control signal CS is High level while the control signal SAEB is Low level, even after the chip select signal CE changes to a Low level. In other words, the control signal CS is High level while data of selected memory cell transistor is read and stored in one of the first and the second latch groups in the latch circuit 7.

The control of address register 1, delay circuit 5 and row decoder 10 by the control signal CS will be described.

The address register 1 stores input address signals AD0 to AD23 when the control signal CS is High level, and erases the stored address signals when the control signal CS is Low level.

The delay circuit 5 outputs the control signal SALF and SALS based on the control signal T0 when the control signal CS is High level, and does not output the control signal SALF and SALS when the control signal CS is Low level.

The row decoder 10 activates one of the word lines WD0 to WD16383 based on input row addresses A0 to A14 when the control signal CS is High level. The row decoder 10 inactivates all of the word lines WD0 to WD16383 when the control signal CS is Low level.

Therefore, the address register 1, delay circuit 5 and row decoder 10 keeps being activated, even if the chip enable signal CE turns to Low level while the latch circuit 7 latches data of memory cell. That is, the latch circuit 7 can completely latch data of the memory cell.

The operation of the semiconductor memory according to the embodiment of the present invention will now be described by referring to FIGS. 1 and 2.

In the semiconductor memory of the present invention, the latch circuit 7 sequentially latches data signals DT0 to DT127 outputted from the sense amplifier circuit 8 to the first latch group and the second latch group beginning at the start address set for the burst output for the latency period, which is setting period of a start address for a burst output.

In the cyclic operation period, which is a period for data burst readout, the latch circuit 7 outputs data latched by one of first and second latch groups, and latches data signal DT0 to DT127 of sense amplifier circuit 8 in the other of first and second latch groups in response to the control signal SAL0, SAL1 and CA0B.

The semiconductor memory according to an embodiment performs the burst readout of data sequentially with interchanging a latch group for outputting data and a group for latching data alternately under a control of the latch pulse selection circuit 6 and the latch control circuit 17.

Therefore whenever a control signal REB is inputted, latched data is sequentially outputted from one of the first latch group and the second latch group in response to the control signal CA0B.

Figure 2:
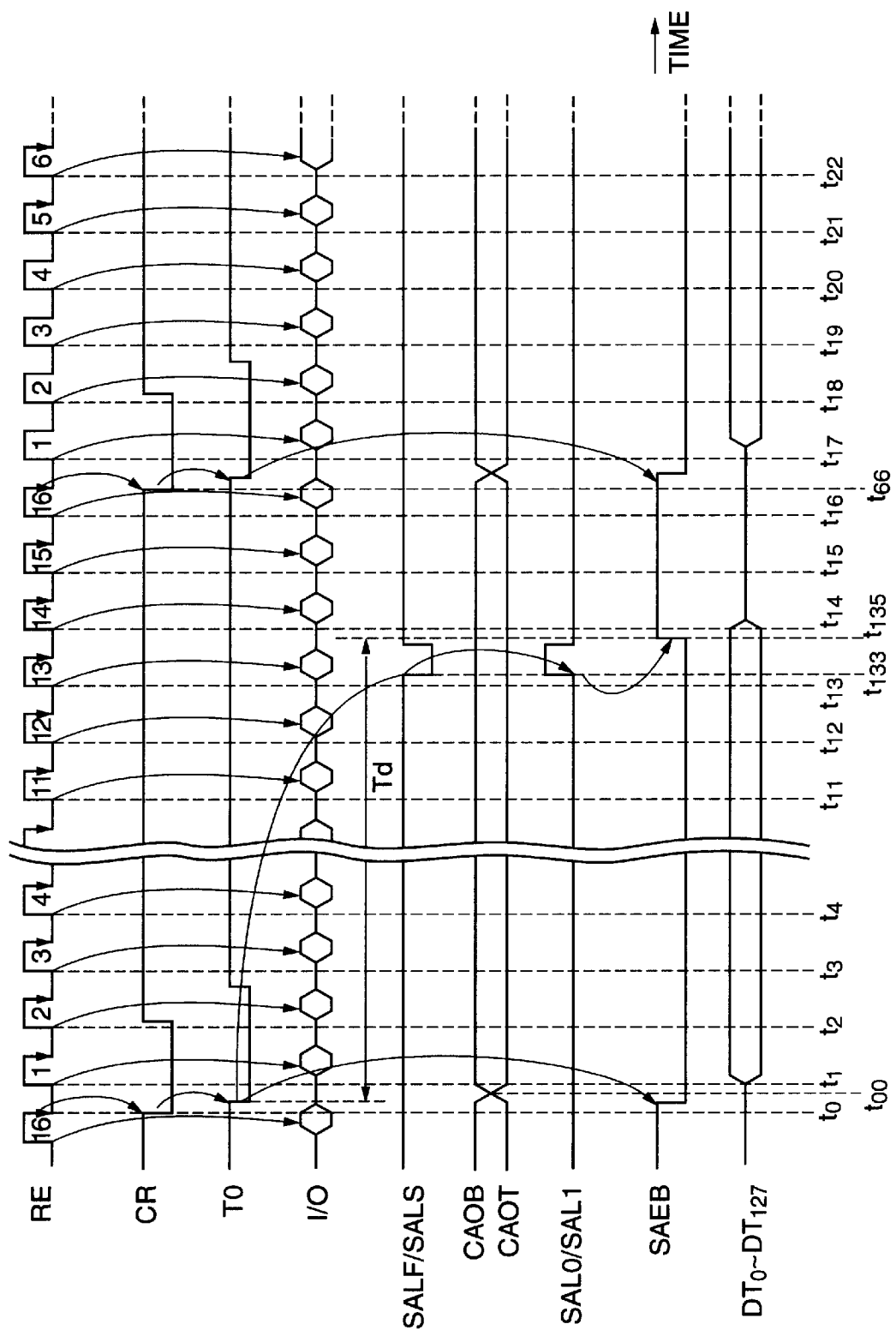
FIG. 2 is a timing chart showing a readout operation of the semiconductor memory according to the embodiment of the present invention.

At time t0 in FIG. 2, the latch group whose data is read out is assumed to be the second latch group. In this condition, the control signal CA0B is High level and the output data of the second latch group is outputted to the page selector 13.

The page selector 13 outputs, for example, the last data signal DL15 to the output terminal T0 via the output buffer 14 in response to control signals PAGE0 to PAGE15 "1000000000000000" of the page decoder 18. In addition, at other output terminals T1 to T7, corresponding signals among the data signals DL16 to DL127 are outputted.

The first counter circuit 2D counts the read signal RE, which the RE buffer 15 outputs every input of a control signal REB. When the first counter circuit 2D counts to 16, that is, when the page address signals PA0 to PA3 counts up from "1111" to "0000", the first counter circuit 2D outputs a carry signal CR with a pulse of a Low level.

Then the ATD circuit 3 outputs a control signal T0 with a pulse of Low level in response to falling edge of the carry signal CR.

The delay circuit 5 outputs a control signal T1 with a pulse of Low level in response to a falling edge of the control signal T0.

Then the sense amplifier control circuit 19 brings the control signal SAEB to a Low level to activate the sense amplifier circuit 8 in response to falling edge of the control signal T1.

The second counter circuit 2U starts a counting operation in response to the carry signal CR and outputs the counted value as column address signals CA0 to CA4 and row address signals RA0 to RA4.

Then, the row decoder 10 activates one of the word lines in response to row address signals RA0 to RA14.

The Y selector 12 outputs data of a memory cell transistor connected to the activated word line as signals YD0 to YD127 to the sense amplifier circuit 8 in response to column address signals CA0 to CA4.

At time t00, the latch control circuit 17 instructs the control signal CA0T to turn from Low level to High level and the control signal CA0B to turn from High level to Low level when the column address signal CA0 turns from Low level to High level by the second counter circuit 2U counting in response to the carry signal CR. Accordingly, the latch output selector 16 outputs data of the first latch group of the page selector 13 instead of data of the second latch group.

At time t1 to t13, the first counter circuit 2D performs a counting operation in response to a falling edge of the control signal RE and outputs the counted value as page address signals PA0 to PA3.

The page selector 13 sequentially outputs data of the first latch group to the output terminals T0 to T7 via the output buffer 14 in response to the control signals PAGE0 to PAGE15.

At time t133, the delay circuit 5 delays the control signal T0 and outputs a control signal SALF and a control signal SALS. The delay time Td is defined as a time period from the falling edge of the control signal T0 to a timing at which output data of the sense amplifier circuit 8 is stabilized.

At time t135, the latch pulse selection circuit 6 outputs a latch signal SAL1 to the latch circuit 16 in order to latch data signals DT0 to DT127 of the sense amplifier circuit 8 to the second latch group. The data signals DT0 to DT127 of the sense amplifier circuit 8 are latched to corresponding latches of the second latch group, respectively.

The rising edges of the control signal SALF and SALS need to be earlier than rising edge of the control signal SAEB in order to latch the data signals DT0 to DT127 accurately to the latch circuit 7.

Therefore the sense amplifier control circuit 19 turns the control signal SAEB from Low level to High level in response to the falling edge of the control signal SALF and the control signal SALS.

Subsequently, at time t14 to t16, the first counter circuit 2D performs a counting operation in response to the control signal REB and outputs the counted value as page address signals PA0 to PA3. The page selector 13 sequentially outputs data of latches of the first latch group, corresponding to control signals PAGE0 to PAGE15. The data signal D0 to D7 is outputted to output terminals T0 to T7 via the output buffer 14.

At time t66, the first counter circuit 2D generates the carry signal CR. Then the ATD circuit 3 outputs the control signal T0, which is pulse signal of Low level, in response to falling edge of the carry signal CR.

The delay circuit 5 outputs the control signal T1, which is Low level, in response to falling edge of the control signal T0. The sense amplifier control circuit 19 turns the control signal SAEB to Low level in response to falling edge of the control signal T1. The sense amplifier circuit 8 is activated according to the control signal SAEB. The second counter circuit 2U counts up in response to the carry signal CR and the column address signal CA0 turns from High level to Low level. Thus, the latch control circuit 17 turns the control signal CA0T from High level to Low level and the control signal CA0B from Low level to High level. Then, the latch output selector 16 outputs data of latches of the second latch group to the page selector 13 instead of data of latches of the first latch group.

At a time t17 to t22, the operation of semiconductor memory of the present invention repeats the process as described before in response to the signal REB.

Figure 3:
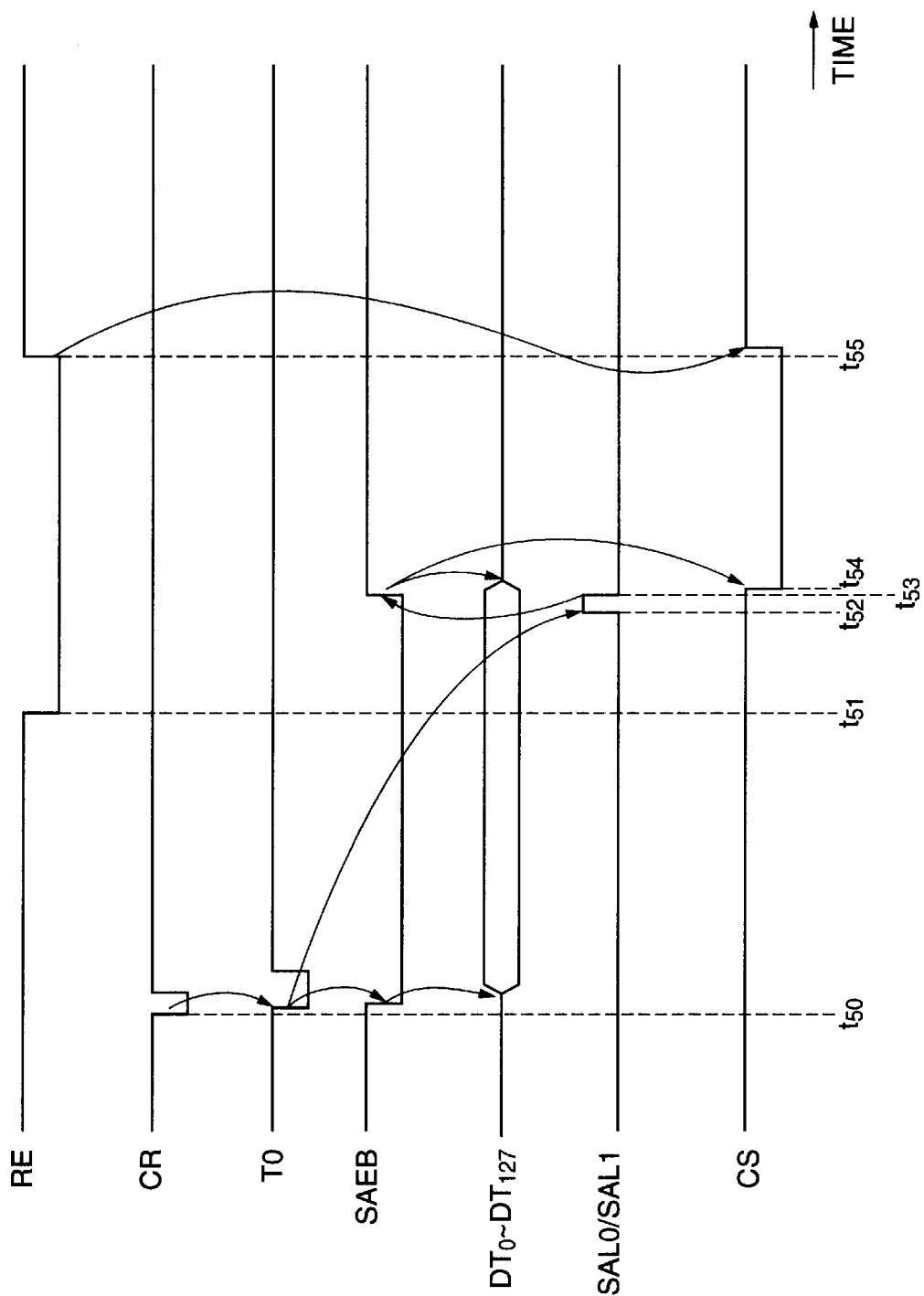
FIG. 3 is a timing chart showing a operation of an enable circuit 25 in FIG. 1.

The operation of the enable circuit 25 will now be described in connection with FIG. 1 and FIG. 3. Referring to FIG. 3, there is shown a timing chart of operation of the enable circuit 25.

In FIG. 3, the latch circuit 7 outputs data of second latch group and latches data in latches of the first latch group when the chip enable signal CE is High level.

At time t50, the latch circuit 7 completes outputting the last data of the second latch group. At this time, the latches of first latch group have already latched data of the sense amplifier circuit 8 to be outputted next.

The counter circuit 2D counts in response to a falling edge of the control signal RE and outputs a carry signal CR as a pulse. Then, the ATD circuit 3 outputs a control signal T0 in response to the carry signal CR.

Subsequently, as described by using the timing chart in FIG. 2, the sense amplifier control circuit 19 generates the control signal SAEB to activate the sense amplifier circuit 8.

The sense amplifier circuit 8 determines data of the memory cell transistor connected to the active word line by the row decoder 10 via the Y selector 12, and outputs as data signals DT0 to DT127.

The column address signal CA0 is turned from Low level to High level by the second counter circuit 2U counting in response to the carry signal CR. The latch control circuit 17 brings the control signal CA0B from High level to Low level and the control signal CA0T from Low level to High level. Thus, the latch circuit 7 outputs data of the first latch group and latches data of sense amplifier circuit 8 in latches of the second latch group.

At time t51, the chip enable signal CE is brought from a High level to a Low level by a CPU (central processing unit) which is not shown in order to bring the semiconductor memory into a standby condition.

However, the enable circuit 25 maintains outputting High level as the control signal CS though the chip enable signal is Low level, because the control signal SAEB is Low level. Therefore, the address register 1, row decoder 10 and delay circuit 8 continue operating, the sense amplifier circuit 8 can also determine accurate data of memory cell transistor.

The output buffer 14, however, is required to bring an output to a high impedance when the semiconductor memory is in standby condition to prevent data from competing with other semiconductor device using data buses.

Therefore, a control signal CEB is provided for the output buffer 14. The enable circuit 25 generates the control signal CEB in response to the chip enable signal CE. Thus, the output buffer 14 is in operating condition and enabled to output data when the control signal CEB is Low level, while the output buffer 14 is in standby condition and sets output terminals TO0 to TO7 to be a high impedance when control signal CEB is at a High level.

At time t52, the delay circuit 5 delays the control signal T0 at time t50 and outputs the control signal SALF and SALS having a pulse of a Low level.

In response to such control signal SALF and SALS, a pulse of the control signal SAL1 rises (changes from a Low level to a High level).

Subsequently, at time t53, the delay circuit 5 brings the control signal SALF and SALS from a Low level to a High level. This causes the pulse of the control signal SAL1 to fall (changes from a High level to a Low level).

Then, each of the latches of the second latch group in the latch circuit 7 latches each of data signals DT0 to DT127 outputted from the sense amplifier circuit 8 in response to the falling edge of the control signal SAL1.

At time t54, the sense amplifier control circuit 19 is inactivated by the control signal SAEB in response to rising edge of the pulse of the control signals SALF and SALS. Then, the latch circuit 7 is deactivated and stops the output of the data signals DT0 to DT127. Moreover, the enable circuit 25 brings the control signal CS from a High level to a Low level. Therefore, the address register 1, the delay circuit 5, and the row decoder 10 are inactivated in response to control signal CS.

At time t55, the chip enable signal CE changes from a Low level to a High level. The enable circuit 25 brings the control signal CS from a Low level to a High level and the control signal CEB from a High level to a Low level. Accordingly, the address register 1, the delay circuit 5, the row decoder 10, and the output buffer 14 shift from the standby condition to the operating condition.

Therefore, if the chip enable signal CE changes to a Low level and the semiconductor memory changes to the standby condition while data is read out from the selected memory cell transistor, the enable circuit 25 continuously activates circuits for readout data of the memory cells until data of memory cells are latched to one of first and second latch groups of the latch circuit 7. That is, the address register 1, the delay circuit 5 and the row decoder 10 are brought into the operating condition until data are latched to one of the first and second latch groups.

As a result, data of the memory cell array 9 is latched to respective latches of the latch group selected by the latch pulse selection circuit 6 in either of the first and the second latch groups.

Figure 4:
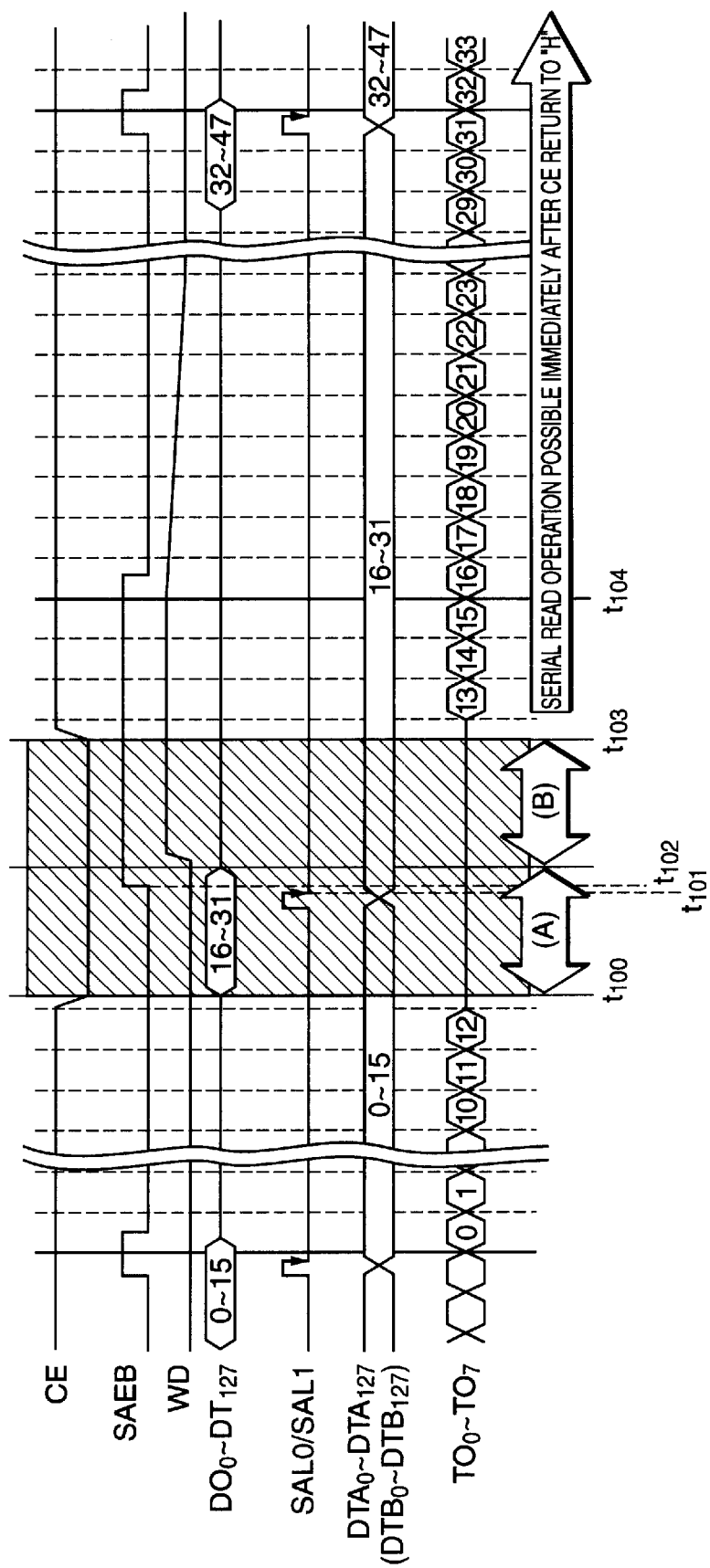
FIG. 4 is a timing chart showing a readout operation of the semiconductor memory when a chip enable signal CE turns Low level according to an embodiment of the present invention.
Figure 5:
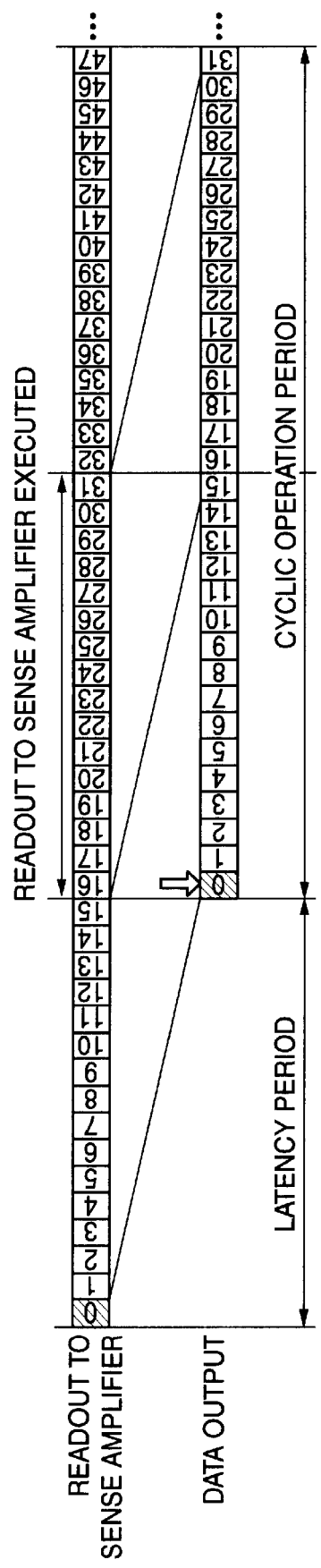
FIG. 5 is a diagram showing a readout operation of a conventional semiconductor memory.
Figure 6:
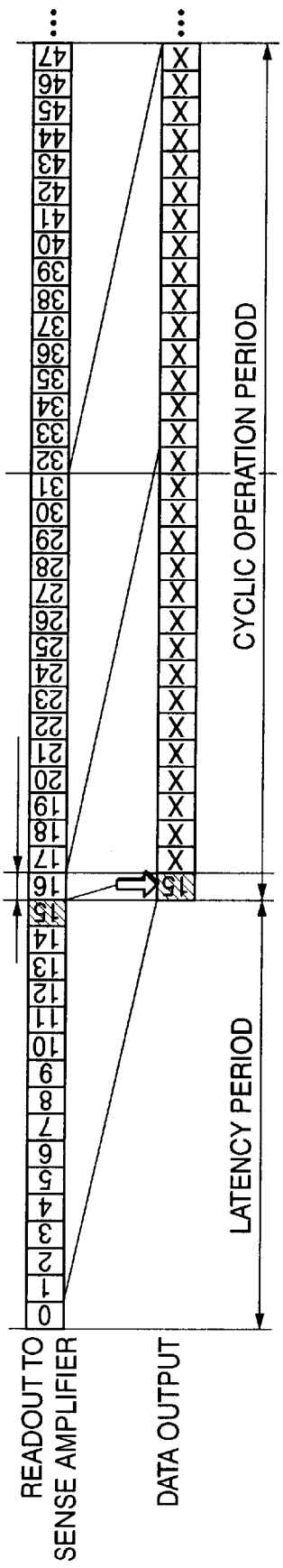
FIG. 6 is a diagram showing a readout operation of a conventional semiconductor memory.

In FIG. 4, the chip enable signal CE changes to Low level when the first counter circuit 2D outputs "1100" as the page address signals PA0 to PA3, that is, a data signal DS11 is outputted at the output terminal TO0. At that time, the control signal CA0B is at Low level, the control signal CA0T is High level the first latch group of the latch circuit 7 outputs data, and data of sense amplifier circuit 8 is latched to the second latch group.

Figure 7:
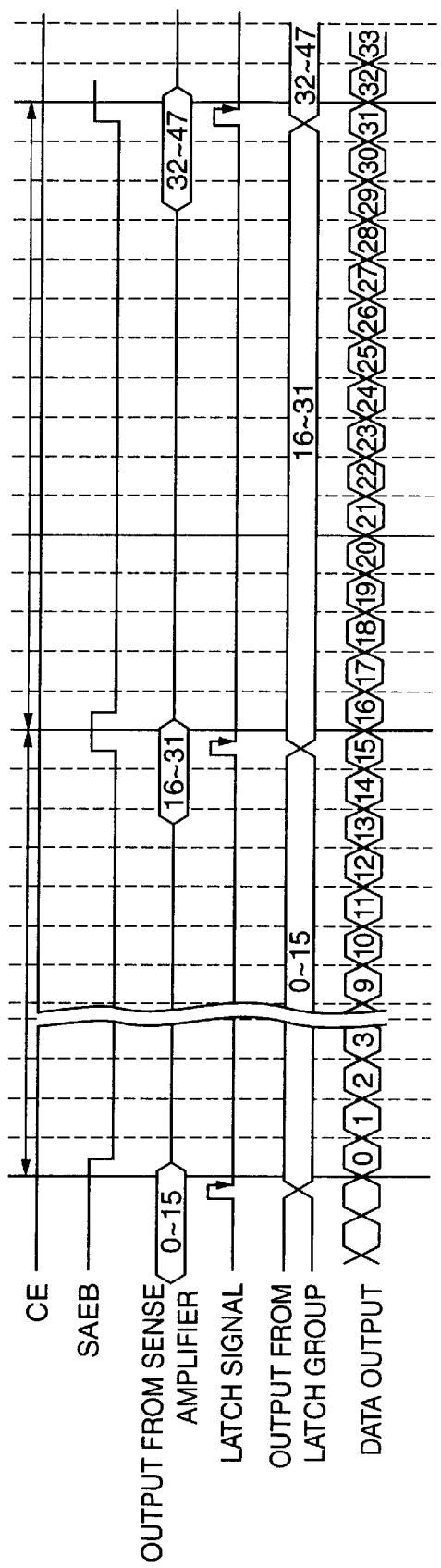
FIG. 7 is a diagram showing a readout operation of a semiconductor memory according to the prior art.
Figure 8:
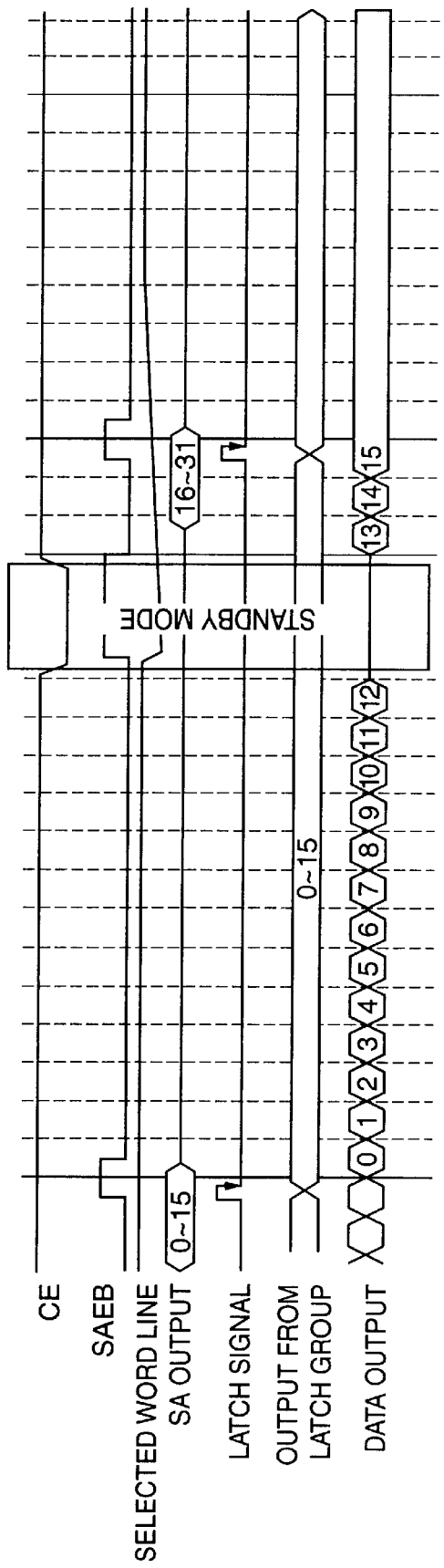
FIG. 8 is a timing chart showing a readout operation of the semiconductor memory when a chip enable signal CE turns Low level according to the prior art.

In the semiconductor memory according to an embodiment of the present invention, a readout operation with the chip enable signal CE being High level is the same as the readout operation in the semiconductor memory shown in FIG. 7.

At time t100, the word line is activated and data signals DT0 to DT127 are outputted from sense amplifier circuit 8 even if the chip enable signal CE changes to Low level and the semiconductor memory is instructed to be in the standby condition, because the control signal CS is kept to be High level. However, since the control signal CEB is turned from Low level to High level, the output terminals TO0 to TO7 have high impedance and the output buffer 14 does not output data.

At time t101, data signals DT0 to DT127, which is byte 16 to 31 to be outputted next, are latched to respective latches of the second latch group in response to the control signal SAL1.

Then, at time t102, the control signal SAEB changes from a Low level to a High level, thus the control signal CS changes from a High level to a Low level. That is, the address register 1, the delay circuit 5, and the row decoder 10 are inactivated, thereby shifting the semiconductor memory to a complete standby condition.

At time t103, the chip enable signal CE changes to a High level, the semiconductor memory changes from the standby condition to the operating condition. Thus, the operation of the semiconductor memory restarts data read operation in response to the control signal RE.

In addition, at time t104, data of page 16, which is latched in the first latch group, is outputted. The latch control circuit 17 instructs the first latch group to latch data of sense amplifier circuit 8 and the second latch group to output latched data. After time t104, data latched at time t101 (data signals DTB0 to DTB127) is sequentially outputted from respective latches of the second latch group in response to the control signal RE.

Therefore, the semiconductor memory according to the present invention does not enter the standby condition immediately after the chip enable signal CE changes to a Low level in area (A), but continues to be active until the data signals DT0 to DT127 read from the sense amplifier circuit 8 are latched to the latch circuit 7.

In addition, the semiconductor memory according to the present invention enters the standby condition after the data signals DT0 to DT127 of the sense amplifier circuit 8 are normally latched to the latch circuit 7 in area (B).

According to the semiconductor memory of the present invention, the control signal CS continues to be kept at a High level while the control signal SAEB is active even if the chip enable signal CE changes to a Low level and the semiconductor memory is instructed to be the standby condition. Thus, circuits required for reading data from the memory cell transistor, which include the address register 1, the delay circuit 5 and the row decoder 10, continue to be in the active condition (operating condition). Therefore, data of the memory cell array 9 can be reliably written into the selected latch group.

Furthermore, according to the semiconductor memory of the present invention, data readout processing is completed in the first latch group and the second latch group during a latency (busy) period and therefore there is enough time to output data from byte 16 to byte 31 stored in the second latch group from an output terminal, when in a random access data of the first latch group is read out from the last byte instead of byte 1. It is possible to secure a determination time for data of the sense amplifier circuit 8 for sufficiently reading the next data from byte 32 to byte 47 to the first latch group, to output continuous data, and to improve an access time.

Moreover, according to the semiconductor memory of the present invention, a latch of the latch circuit 7 is divided into the first latch group or the second latch group (or independently arranged) so as to output alternately-stored data from output terminals, and therefore a determination time for data of the sense amplifier can be secured while data stored in one of the latch groups is read out in order to store the next data into the other latch group from the sense amplifier circuit 8, thereby achieving a configuration for selecting a digit line by using the selector circuit 12 to supply current to the sense amplifier circuit 8 and reducing the number of sense amplifiers for determining data read from the memory cell transistor to the digit line.

Therefore, the above semiconductor memory achieves a reduced chip area by an area which may be required for a formation of the omitted number of sense amplifiers so as to reduce the manufacturing cost.

In addition, according to the semiconductor memory of the present invention, the number of sense amplifiers is reduced, thus enabling the power consumption to be lowered by decreasing driving current for driving sense amplifiers, and the driving time for the sense amplifiers is limited to the time for storing data to the latch circuit 7, thus enabling the power consumption to be lowered.

Therefore, the above semiconductor memory is capable of significantly lowering the power consumption, thereby enabling the operating time for use in portable information units to extend.

Furthermore, according to the above semiconductor memory, a signal BUSY is outputted to an external circuit or an external unit if both of the first and second latch groups in the latch circuit 7 detect a completion of reading data during a busy period, thereby enabling the external circuit or the external unit to change the random access time according to an access time of the semiconductor memory, for example, to shorten the random access time.

Although the configuration has been described in the above, the present invention is not limited to the mask ROM, but it is also applicable to an EPROM (erasable programmable ROM), an EEPROM (electrically erasable programmable ROM), a flash memory, and the like for a purpose of fast reading and power saving.

What is claimed is:

1. A semiconductor memory device, comprising:
   a memory cell array having a plurality of memory cells;
   a plurality of word lines connected to said memory cells;
   a row decoder connected to said word lines so as to selectively enable one of said word lines;
   a plurality of digit lines coupled to said memory cells;
   a sense amplifier circuit having a plurality of sense amplifiers, each of said sense amplifiers being coupled to a respective one of said digit lines;
   a first latch circuit connected to said sense amplifier circuit so as to latch data of said digit lines; and
   a control circuit coupled to said row decoder and provided with a chip enable signal which is indicative of an operation mode of said semiconductor memory device so as to inactivate said row decoder when both said first latch circuit finishes latching said data of said digit lines and said chip enable signal is indicative of standby mode of said semiconductor memory device,
   wherein said sense amplifier circuit is inactivated when said first latch circuit finishes latching said data of said digit lines.

2. The semiconductor memory device as claimed in claim 1, further comprising:
   an output buffer circuit coupled to said first latch circuit, wherein said control circuit activates said output buffer circuit when said chip enable signal is not indicative of said standby mode, and said control circuit inactivates said output buffer circuit immediately when said chip enable signal is indicative of said standby mode.

3. The semiconductor memory device as claimed in claim 1, further comprising:
   a latch pulse circuit coupled to said first latch circuit so as to generate a latch pulse signal; and
   a sense amplifier control circuit coupled to said sense amplifier circuit so as to generate a sense amplifier control signal for inactivating said sense amplifier in response to said latch pulse signal;
   wherein said first latch circuit latches said data of said digit lines in response to said latch pulse signal,
   wherein said control circuit inactivates said row decoder in response to both said sense amplifier control signal and said chip enable signal indicative of standby mode of said semiconductor memory device.

4. The semiconductor memory device as claimed in claim 3, further comprising:
   a counter circuit coupled to both said latch pulse circuit and said sense amplifier control circuit and provided with a read control signal so as to count transitions of said read control signal and generate a page address and a carry signal;
   a page select circuit coupled to said counter circuit so as to divide said data of said digit lines in response to said page address;
   wherein said latch pulse circuit is provided with said carry signal and generates said latch pulse signal after a predetermined time from receiving said carry signal.

5. The semiconductor memory device as claimed in claim 1, further comprising:
   a second latch circuit connected to said sense amplifier circuit so as to latch said data of said digit lines when said first latch circuit outputs latch data and to output latched data when said first latch circuit latches said data of said digit lines,
   wherein said control circuit controls said row decoder to activate until one of said first and second latch circuit finishes latching said data of said digit lines.

6. The semiconductor memory device as claimed in claim 1, further comprising:
   a counter circuit coupled to said sense amplifier circuit and provided with both an address signal as an initial value and a read control signal so as to count transitions of said read control signal and to generate a page address and a carry signal;
   wherein said sense amplifier is activated when said carry signal is generated and is inactivated when said first latch circuit finishes latching said data of said digit lines.

7. The semiconductor memory device as claimed in claim 4, wherein said first latch circuit latches said data of said digit lines in a predetermined time after generating said carry signal.

8. The semiconductor memory device as claimed in claim 4, further comprising:
   a page selector circuit coupled to said first latch circuit so as to divide data outputted from said first latch circuit and to provide divided data for said output buffer circuit in response to said page address.

9. A semiconductor memory device, comprising:
   a memory cell array having a plurality of memory cells;
   a plurality of word lines connected to said memory cells;
   a row decoder connected to said word lines so as to selectively enable one of said word lines in response to address signals;
   a first selector connected to plurality of digit lines so as to selectively enable some of said digit lines;
   a sense amplifier circuit having a plurality of sense amplifiers, said sense amplifiers being connected to said enable digit lines;
   first and second latch circuits each connected to said sense amplifier circuit so as to latch data of said selected digit lines;
   a counter circuit coupled to said sense amplifier circuit and said first and second latch circuits, and provided with said address signals as an initial value so as to count up and generate a page address and a carry signal;
   a page selector connected to said first and second latch circuits so as to divide data latched in one of said first and second latch circuits in response to said page address;
   an output buffer circuit connected to said page selector so as to output said divided data; and
   a control circuit provided with a chip enable signal so as to control an operation mode of said semiconductor memory device in response to said chip enable signal,
   wherein said row decoder and said output buffer circuit are activated until one of said first and second latch circuits finishes latching said data of said selected digit lines despite said chip enable signal being indicative of standby mode of said semiconductor memory device by said control circuit, said output buffer circuit being immediately inactivated when said chip enable signal is indicative of said standby mode by said control circuit.

10. The semiconductor memory device as claimed in claim 9 further comprising:
    a sense amplifier enable circuit coupled between said counter circuit and said sense amplifier circuit so as to generate a sense amplifier enable signal in response to said carry signal; and
    a latch pulse generator coupled between said counter circuit and each of said first and second latch circuits so as to output a latch pulse signal to one of said first and second latch circuits in response to both said carry signal and said address signals;
    wherein said sense amplifier enable signal is activated in response to generating said carry signal and is inactivated in response to said activated latch pulse signal, said activated sense amplifier enable signal activating said sense amplifier circuit, said control circuit controlling said row decoder in response to said sense amplifier enable signal.

11. The semiconductor memory device as claimed in claim 10, wherein said latch pulse signal is generated after a predetermined time from generating said carry signal.

12. A method of accessing a semiconductor memory including a plurality of memory cells and a selection circuit for selecting memory cells, said method comprising the steps of:
    performing a selection operation on the memory cells by said selection circuit to read out data therefrom;
    latching said data;
    inactivating said selection circuit in response to a control signal that instructs inactivation of said semiconductor memory; and allowing, when said control signal is supplied to said semiconductor memory while said selection circuit is performing said selection operation, said selection circuit to continue said selection operation irrespective of said control signal until the data read out from the memory cells are latched.

13. The method as claimed in claim 12, wherein said selection circuit includes a row decoder, a column decoder and a sense amplifier, said row and column decoders and said sense amplifier being allowed, when said control signal is supplied to said semiconductor memory while said selection circuit is performing said selection operation, to keep activated irrespective of said control signal until the data read out from the memory cells are latched.

14. The method as claimed in claim 12, wherein said semiconductor memory further includes first and second latch circuits and the data are latched in said first latch circuit, said method further comprising outputting a content of said first latch circuit and performing the selection operation on the memory cells by said selection circuit to latch data therefrom into said second latch circuit while the content of said first latch circuit is being outputted.

* * * * *